(12) United States Patent
Micko

(10) Patent No.: US 7,042,134 B2
(45) Date of Patent: May 9, 2006

(54) TRANSCONDUCTANCE CIRCUIT FOR PIEZOELECTRIC TRANSDUCER

(75) Inventor: Eric Scott Micko, Rescue, CA (US)

(73) Assignee: Suren Systems, Ltd., Hong Kong (CN)

( * ) Notice: Subject to any disclaimer, the term of this patent is extended or adjusted under 35 U.S.C. 154(b) by 192 days.

(21) Appl. No.: 10/812,603

(22) Filed: Mar. 30, 2004

(65) Prior Publication Data

US 2004/0189149 A1    Sep. 30, 2004

Related U.S. Application Data

(60) Provisional application No. 60/459,516, filed on Mar. 31, 2003.

(51) Int. Cl.
*H01L 41/08* (2006.01)

(52) U.S. Cl. ................... 310/316.01; 310/317

(58) Field of Classification Search ........... 310/316.01, 310/317, 319
See application file for complete search history.

(56) References Cited

U.S. PATENT DOCUMENTS

| | | | |
|---|---|---|---|
| 6,028,491 A | 2/2000 | Stanchak et al. | 310/314 |
| 6,340,816 B1 | 1/2002 | Micko | 250/338.3 |
| 6,448,689 B1 * | 9/2002 | Satoh | 310/316.01 |
| 6,647,764 B1 * | 11/2003 | Paul et al. | 73/54.41 |
| 6,741,137 B1 * | 5/2004 | Sibrai et al. | 331/109 |
| 6,848,299 B1 * | 2/2005 | Paul et al. | 73/64.53 |

OTHER PUBLICATIONS

PerkinElmer Optoelectronics; "Elementorientation and Connections LHI 2068" Drawing No. 2/71197; May 14, 2001.

* cited by examiner

*Primary Examiner*—Mark Budd
(74) *Attorney, Agent, or Firm*—John L. Rogitz

(57) ABSTRACT

A transconductance monitoring and amplifying circuit for a piezoelectric transducer that may be used in, e.g., a motion detector system includes a FET, with the transducer (and, hence, the signal voltage reference) floating between the gate and source of the FET, as opposed to being connected to the common ground of the circuit. This permits the development of a larger detector signal and concomitantly the use of a relatively inexpensive FET instead of a relatively more expensive high impedance operational amplifier as must be used in conventional transconductance circuits.

28 Claims, 3 Drawing Sheets

TRANSCONDUCTANCE CIRCUIT FOR PIEZOELECTRIC TRANSDUCER

RELATED APPLICATIONS

Priority is claimed from U.S. provisional application Ser. No. 60/459,516, filed Mar. 31, 2003, incorporated herein by reference.

I. FIELD OF THE INVENTION

The present invention relates generally to piezoelectric transducer systems.

II. BACKGROUND OF THE INVENTION

Piezoelectric sensor systems are used in a wide variety of applications. As but one non-limiting example, some security systems detect movement in a monitored space using passive infrared (PIR) motion sensors, which detect changes in far infrared radiation (8–14 micron wavelength) due to temperature differences between an object (e.g. a human) and its background environment. Upon detection, motion sensors generally transmit an indication to a host system, which may in turn activate an intrusion "alarm", change room lighting, open a door, or perform some other function. Such sensors advantageously are simple and relatively inexpensive.

The detectors of a PIR sensor can include pyroelectric detectors that measure changes in far infrared radiation. Such detectors operate by the "piezoelectric effect", which causes electrical charge migration in the presence of mechanical strain. Pyroelectric detectors take the form of a capacitor—two electrically conductive plates separated by a dielectric. The dielectric can be a piezoelectric ceramic. When far infrared radiation causes a temperature change (and thus some mechanical strain) in the ceramic, electrical charge migrates from one plate to the other. If no external circuit (or a very high impedance circuit) is connected to the detector ("voltage output mode"), then a voltage that can be measured appears as the "capacitor" charges. If an external circuit of relatively low impedance is connected between the plates ("current output mode"), then a current flows.

A piezoelectric detector in the current output mode is placed in a transconductance amplifier circuit, in which, in lieu of allowing the voltage between the plates of the transducer to change substantially, charge is conducted through a feedback resistor of a high impedance operational amplifier to create a voltage that establishes the output signal of the circuit. By "high" impedance is meant an impedance of at least $10^7$ Ohms.

The present invention is directed to providing inexpensive versions of transconductance circuits. As understood herein, heretofore transconductance circuits for piezoelectric detectors have required relatively expensive high impedance operational amplifiers as a result of having to measure small amounts of charge produced by piezoelectric detectors. As further understood herein, less expensive circuits can be provided using the inventive concepts herein.

SUMMARY OF THE INVENTION

Several versions of a transconductance circuit for, e.g., a piezoelectric far infrared radiation detector that may be implemented in an infrared motion sensor are disclosed.

Accordingly, a piezoelectric detector includes a piezoelectric transducer and a transconductance circuit electrically connected to the transducer. The transconductance circuit defines a common ground and a signal voltage reference that is not directly connected to the common ground.

In some embodiments, a transconductance resistor may be connected to the gate of a field effect transistor (FET), and the transconductance circuit has no high impedance operational amplifier. An output resistor may be connected to the source of the FET, potentially through a bipolar junction transistor (BJT) the base of which may be connected to the source of the FET. If desired, a "shorting" capacitor which provides a near-short circuit at sensor signal operating frequencies can connect the drain of the FET to the source of the FET. Also, an alternating current (AC) coupled output feedback voltage divider can be connected between the source of the FET and a transconductance resistor connected to the gate of the FET.

In specific non-limiting embodiments the transconductance resistor is connected to the gate of the FET through a standard input impedance operational amplifier. The inverting input of the operational amplifier may be connected to the source of the FET, and the non-inverting input of the operational amplifier may be connected to a signal voltage reference. Also, an AC-coupled output feedback voltage divider can be connected between the output of the operational amplifier and the transconductance resistor that is connected to the gate of the FET.

In another aspect, in a transconductance detector circuit including a piezoelectric transducer, a field effect transistor (FET) is connected to the transducer for amplifying a signal therefrom. The circuit also has a circuit common ground and a signal voltage reference node that is at an AC potential other than ground.

In still another aspect, a circuit includes a piezoelectric transducer and a transconductance amplifier circuit receiving, along an electrical path, a signal from the transducer and processing the signal to produce an output. The transconductance amplifier circuit does not include a high impedance operational amplifier.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
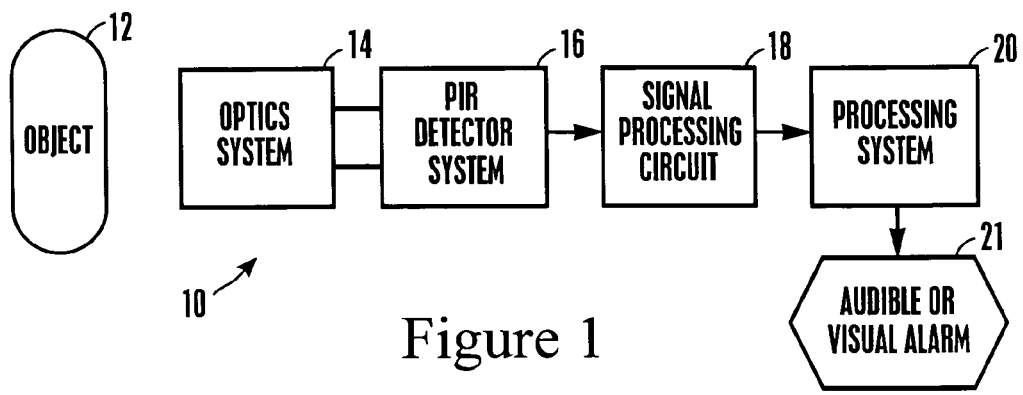
FIG. 1 is a block diagram of the present system architecture.

Referring initially to FIG. 1, an exemplary non-limiting system is shown, generally designated 10, for detecting a moving object 12, such as a human. The system 10 includes an optics system 14 that can include appropriate mirrors, lenses, and other components known in the art for focussing images of the object 12 onto a passive infrared (PIR) detector system 16. In response to the moving object 12, the PIR detector system 16 generates a signal that can be filtered, amplified, and digitized by a signal processing circuit 18, with a processing system 20 (such as, e.g., a computer or application specific integrated circuit) receiving the signal and determining whether to activate an audible or visual alarm 21 or other output device such as an activation system for a door, etc.

Figure 2:
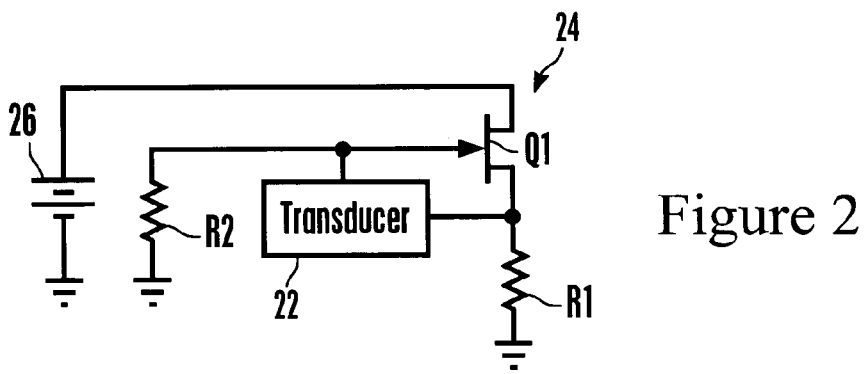
FIG. 2 is a schematic diagram of a first embodiment of the present transconductance circuit.

Having described one application of the piezoelectric detector of the present invention, attention is now directed to FIGS. 2–5, which show various implementations of the present inventive concept. As shown in FIG. 2, a piezoelectric transducer 22 is provided in a transconductance circuit 24 having a direct current (DC) voltage supply 26. The circuit 24 can be thought of as a monitoring circuit for the piezoelectric transducer 22. Also, the circuit 24 impedance-buffers and amplifies the signal from the transducer 22.

In accordance with present principles, a "transconductance circuit" is one in which, in lieu of allowing the voltage between the plates of a transducer such as the transducer 22 to change substantially, charge is conducted through a resistor to create a voltage that establishes the output signal of the circuit.

The piezoelectric transducer 22 can be any piezoelectric transducer. In one exemplary illustration. the piezoelectric transducer 22 is a pyroelectric detector that measures changes in far infrared radiation by the "piezoelectric effect", which causes electrical charge migration in the presence of mechanical strain that can be induced by, e.g., far infrared radiation-induced temperature change. The piezoelectric transducer 22 may take the form of a capacitor, i.e., two electrically conductive plates separated by a dielectric which can be a piezoelectric ceramic. When the ceramic of the piezoelectric transducer 22 experiences mechanical strain, electrical charge migrates from one plate to the other plate.

In the circuit 24 shown in FIG. 2, the transducer 22 is connected between the source and the gate of a junction field effect transistor (FET) Q1 that may be implemented by a type 2N4338 FET in a non-limiting embodiment. The power supply 26, which can be a five volt power supply established by one or more dry cell batteries, is connected to the drain of the FET Q1 as shown.

As shown in FIG. 2, the source current of the FET Q1 is changed to a voltage by passing it through an output resistor R1. The voltage is connected via a transconductance resistor R2 and causes a current to flow back to the gate of the FET Q1, with both resistors R1, R2 being connected to ground but with the transducer 22 "floating" (i.e., with its signal reference voltage not connected to ground) between the source and gate of the FET Q1.

With the above structure, the skilled artisan will recognize that the FET Q1 controls the feedback current through the transconductance resistor R2 to the gate of the FET Q1 by varying the voltage across the output resistor R1, which, via the ground node, impresses the same changing voltage across the transconductance resistor R2. The alternating current (AC) component of the output of the circuit 24, which can be mathematically calculated in sufficient accuracy to reflect essential circuit function by multiplying the output current of the transducer 22 by the resistance of the transconductance resistor R2, is measured across the output resistor R1. The direct current (DC) component of the output is determined by the gate-source operating voltage of the FET Q1.

In other words, the signal voltage reference node of the circuit 24 floats with respect to the circuit common ground, in contrast to conventional non-transconductance circuits in which the signal voltage reference node is grounded and the FET is used as a buffer for a piezoelectric detector operated in a voltage output mode. Consequently, the present combination of transconductance circuit structure produces the characteristic larger signal voltage as compared to conventional voltage output mode circuits, while advantageously permitting the use of a relatively inexpensive FET Q1 of the same type as used in conventional voltage output mode circuits in lieu of a relatively more expensive high impedance operational amplifier. Viewed another way, the circuit 24 shown in FIG. 2 in essence has three functional blocks, namely, the transducer 22, the FET Q1, and the transconductance resistor R2, with the latter being a feedback element, in contrast to conventional voltage output mode circuits.

Figure 3:
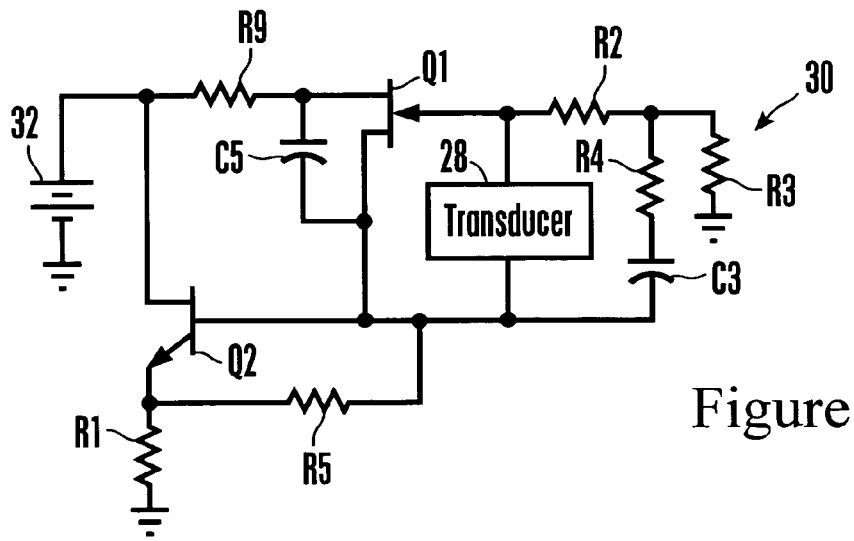
FIG. 3 is a schematic diagram of a second embodiment of the present transconductance circuit.
Figure 4:
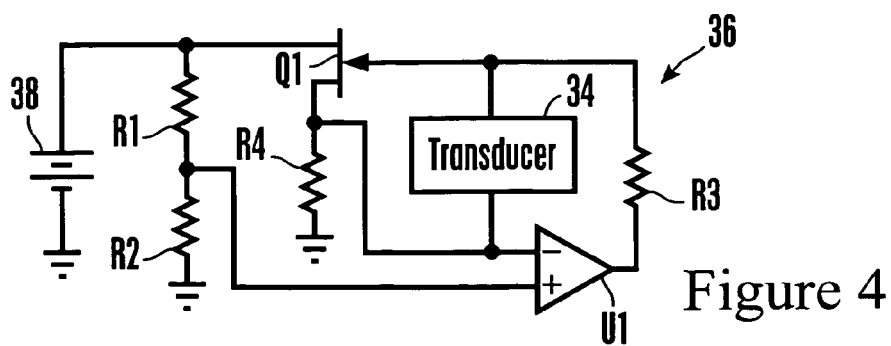
FIG. 4 is a schematic diagram of a third embodiment of the present transconductance circuit.
Figure 5:
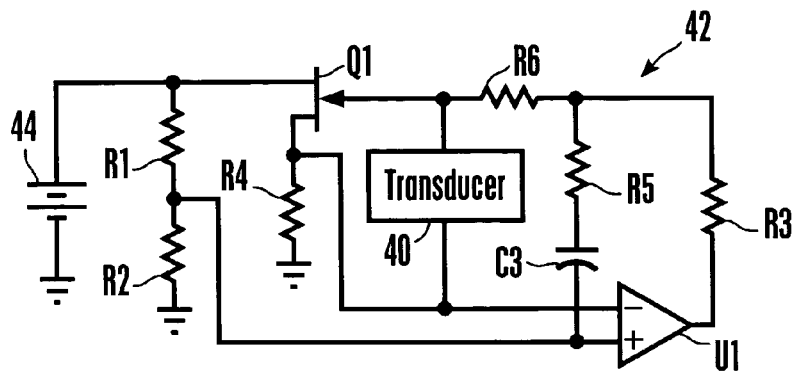
FIG. 5 is a schematic diagram of a fourth embodiment of the present transconductance circuit.

FIGS. 3–5 show various circuits that add components to those of FIG. 2 to increase even further the signal developed by the circuits. As shown in FIG. 3, a piezoelectric transducer 28 is provided in a transconductance circuit 30 having a DC voltage supply 32. In the circuit 30 shown in FIG. 3, the transducer 28 is connected between the source and the gate of a junction field effect transistor (FET) Q1 and, thus, the signal voltage reference of the circuit 30 floats with respect to the circuit common ground. The power supply 32 is connected to the drain of the FET Q1 as shown through a drain resistor $R_D$.

In the circuit shown in FIG. 3, not only is the FET Q1 provided, but a bipolar junction transistor (BJT) Q2 as well, in addition to further circuit elements discussed below. If desired, an inexpensive standard input impedance operational amplifier may be used instead of the BJT Q2. By "standard input impedance" is meant an impedance of no more than $10^7$ Ohms.

In the embodiment shown in FIG. 3, the base of the BJT Q2 is connected to the transducer 28 and to the source of the FET Q1 as shown, with the emitter of the BJT Q2 being connected to grounded output resistor R1 and with the collector of the BJT Q2 being connected to the power supply 32 and being separated from the drain of the FET Q1 by the drain resistor $R_D$. Because of the extra gain provided by the BJT Q2 and because its base is connected to the source of the FET Q1, an output feedback voltage divider that is established by resistors R3, R4 and a capacitor C3 can be added so as to amplify the basic transconductance voltage developed across a transconductance resistor R2 by, for example, ten, with this voltage being fed back as a current to the gate of the FET Q1 through the transconductance resistor R2. Thus, the AC component of the output of the circuit 30 (as measured across the output resistor R1) in FIG. 3 may be ten times that of the circuit 24 shown in FIG. 2, given the same stimulus energy to the transducers of both circuits.

Additionally, in the circuit 30 shown in FIG. 3 the drain of the FET Q1 is essentially short-circuited (for AC signals) by a shorting capacitor $C_S$ to the source of the FET Q1, which, as noted previously, is the signal voltage reference node. With the FET Q1 drain essentially short-circuited to the signal voltage reference node, the internal capacitance of the FET Q1 no longer establishes an undesirable feedback element, extending the high frequency response of the circuit 30.

Now referring to FIG. 4, a piezoelectric transducer 34 is provided in a transconductance circuit 36 having a DC voltage supply 38. In the circuit 36 shown in FIG. 4, the transducer 34 is connected between the source and the gate of a junction field effect transistor (FET) Q1 and, thus, the signal voltage reference of the circuit 36 floats with respect to the circuit common ground. The power supply 38 is connected to the drain of the FET Q1 as shown.

In the embodiment shown in FIG. 4, an inexpensive standard input impedance operational amplifier U1 has its inverting input connected to the transducer 34 and to the source of the FET Q1, which is indirectly connected to ground (i.e., through a resistor R4). The output of the operational amplifier U1 is fed back to the gate of the FET Q1 through a transconductance resistor R3. Also, the non-inverting input of the operational amplifier U1 is connected to a voltage divider consisting of a resistor R1, which in turn is connected to the power supply 38, and a resistor R2, which is connected to ground.

As was the case in the previously-described circuits, the voltage across the FET source resistor R2 that is developed from the source current is fed back as a current to the gate of the FET Q1. The feedback path extends through the operational amplifier U1 in the circuit 36 shown in FIG. 4 and through a transconductance resistor R3. The transconductance current summing node is at the gate of the FET Q1, which buffers the inverting input of the operational amplifier U1. The non-inverting input of the operational amplifier U1 is the "floating" signal voltage reference node for the circuit 36. The operational amplifier U1 varies its output voltage to control the feedback current through the transconductance resistor R3, with the output signal of the circuit being the AC component of the output voltage of the operational amplifier U1, the DC component being determined by the gate-source operating voltage of FET Q1.

The circuit 36 in FIG. 4 provides an essentially constant voltage (maintained by the operational amplifier U1 at its inverting input) for a signal voltage reference node. Accordingly, the FET Q1 drain-gate voltage is essentially constant compared to the amplifier output and feedback voltage fed back as a current through the transconductance resistor R3 to the gate of the FET Q1. Consequently, there is no high frequency limit due to any effect of the FET Q1 internal drain-gate capacitance, so a resistor-capacitor pair $R_D$-$C_S$ shown in the transistor-only circuit of FIG. 3 is not required in the circuit 36 of FIG. 4.

FIG. 5 shows a piezoelectric transducer 40 in a transconductance circuit 42 having a DC voltage supply 44 that in all essential respects is identical to the circuit 36 shown in FIG. 4, except that a resistor R5 and a capacitor C3 are provided between the non-inverting input of an operational amplifier U1 and a feedback resistor R3, a transconductance resistor R6 being provided between the tap of the resistor R5/capacitor C3 pair and the gate of the FET Q1. Because of the ample gain provided by the operational amplifier U1, the output voltage divider established by the resistors R3 and R5 and the capacitor C3 can amplify the basic transconductance voltage by, e.g., ten.

FIGS. 6–9 respectively correspond to FIGS. 2–5, with the respective circuits being essentially identical as shown except that in the variations shown in FIGS. 6–9, the AC and DC connections to the transducer are separated from each other, so as to avoid such high DC outputs that the circuit enters a condition known as "saturation" where the circuit DC output voltage should be (from an ideally calculated standpoint) more positive than the positive end of the power supply or more negative than the negative end of the power supply. Since this is not possible in reality, the circuit DC output can become "stuck" against either the positive or negative end of the power supply, in which case no AC signals are possible, otherwise rendering the circuit totally non-functional. Such high DC outputs could result from DC amplification due to the parallel leakage resistance present in some transducers. When functioning properly the circuits shown in FIGS. 6–9 operate just like their respective counterparts in FIGS. 2–5, because it is the AC signal that is used in the present invention, not the DC signal.

Figure 6:
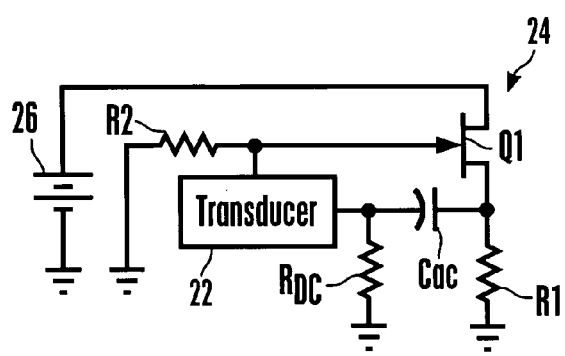
FIG. 6 is a schematic diagram of a modified version of the first embodiment shown in FIG. 2, wherein the alternating current (AC) and direct current (DC) connections to the transducer are separated from each other to avoid DC outputs that, if sufficiently high, might otherwise saturate the circuit.
Figure 7:
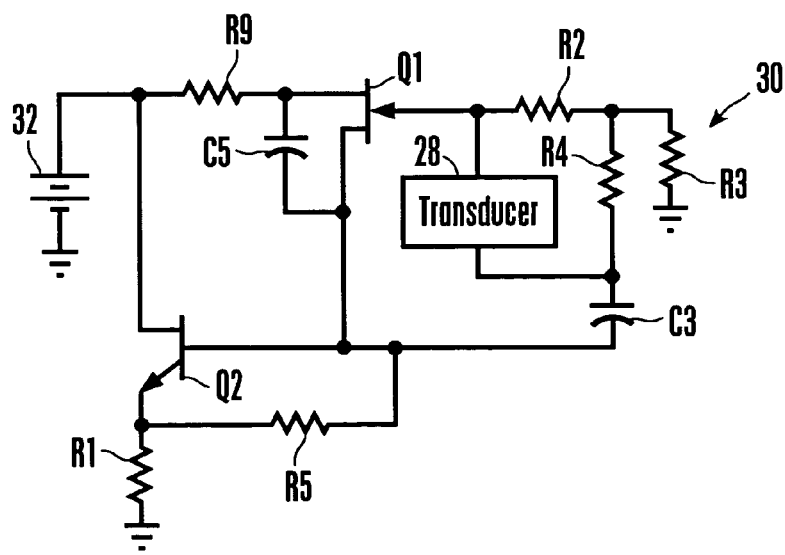
FIG. 7 is a schematic diagram of a modified version of the second embodiment shown in FIG. 3, wherein the AC and DC connections to the transducer are separated from each other.
Figure 8:
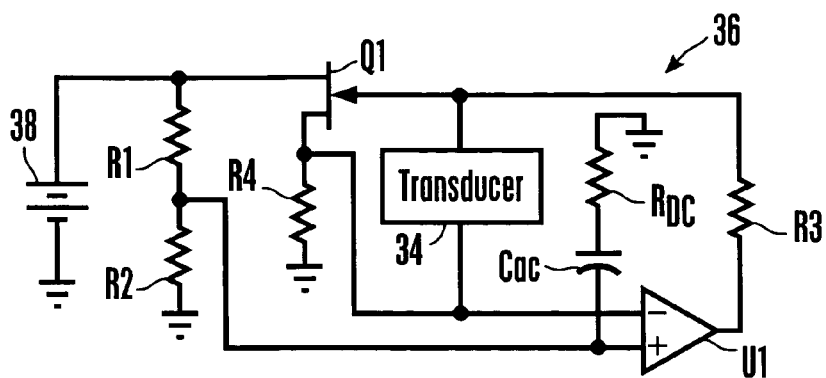
FIG. 8 is a schematic diagram of a modified version of the third embodiment shown in FIG. 4, wherein the AC and DC connections to the transducer are separated from each other.
Figure 9:
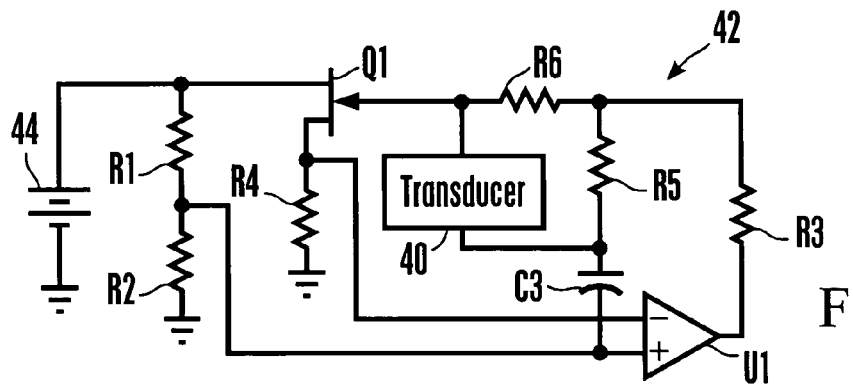
FIG. 9 is a schematic diagram of a modified version of the fourth embodiment shown in FIG. 5, wherein the AC and DC connections to the transducer are separated from each other.

The above separation of AC from DC is accomplished in FIGS. 6 and 8 by passing the AC component of the transducer output signal through an AC-passing DC-blocking capacitor $C_{AC}$ and thence to the signal processing circuitry, i.e., to the FET Q1 in FIG. 6 and to the operational amplifier U1 in FIG. 8, while shunting the DC component of the transducer output signal to ground through a DC grounding resistor $R_{DC}$. In FIGS. 7 and 9, on the other hand, recognizing that an AC-passing, DC-blocking capacitor C3 already exists in these circuits, the outputs of the respective transducers are connected to a line between the capacitor C3 and resistor (R4 in FIG. 7, R5 in FIG. 9) in these circuits.

While the particular TRANSCONDUCTANCE CIRCUIT FOR PIEZOELECTRIC TRANSDUCER as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for" or, in the case of a method claim, the element is recited as a "step" instead of an "act". Absent express definitions herein, claim terms are to be given all ordinary and accustomed meanings that are not irreconcilable with the present specification and file history.

What is claimed is:

1. A piezoelectric detector, comprising:
   a piezoelectric transducer;
   a transconductance circuit electrically connected to the transducer, the transconductance circuit defining a common ground and a signal voltage reference not directly connected to the common ground; and
   a transconductance resistor connected to the gate of a field effect transistor (FET), the transconductance circuit having no operational amplifier with an impedance greater than $10^7$ Ohms.

2. The detector of claim 1, wherein the transconductance resistor is connected to the gate through an operational amplifier.

3. The detector of claim 2, wherein the inverting input of the operational amplifier is connected to the source of the FET.

4. The detector of claim 3, wherein the non-inverting input of the operational amplifier is connected to a signal voltage reference.

5. The detector of claim 1, comprising an output resistor connected to the source of the FET.

6. The detector of claim 5, wherein the output resistor is connected to the FET through a bipolar junction transistor (BJT).

7. The detector of claim 6, wherein the base of the BJT is connected to the source of the FET.

8. The detector of claim 1, comprising a shorting capacitor connecting the drain of the FET to the source of the FET.

9. The detector of claim 1, comprising an output voltage divider connected between the gate of the FET and the source of the FET.

10. A transconductance detector circuit including a piezoelectric transducer, a field effect transistor (FET) connected to the transducer for amplifying a signal therefrom, a circuit common ground, and a signal voltage reference node at an AC potential other than ground.

11. The transconductance detector circuit of claim 10, comprising a transconductance resistor connected to the gate of the FET.

12. The transconductance detector circuit of claim 11, wherein the transconductance resistor is connected to the gate through an operational amplifier.

13. The transconductance detector circuit of claim 12, wherein the inverting input of the operational amplifier is connected to the source of the FET.

14. The transconductance detector circuit of claim 13, wherein the non-inverting input of the operational amplifier is connected to a signal voltage reference.

15. The transconductance detector circuit of claim 11, comprising an output resistor connected to the source of the FET.

16. The transconductance detector circuit of claim 15, wherein the output resistor is connected to the FET through a bipolar junction transistor (BJT).

17. The transconductance detector circuit of claim 16, wherein the base of the BJT is connected to the source of the FET.

18. The transconductance detector circuit of claim 11, comprising a shorting capacitor connecting the drain of the FET to the source of the FET.

19. The transconductance detector circuit of claim 11, comprising an output voltage divider connected between the gate of the FET and the source of the FET.

20. A circuit, comprising:
    at least one piezoelectric transducer;
    at least one transconductance amplifier circuit receiving, along an electrical path, a signal from the transducer and processing the signal to produce an output; and
    a transconductance resistor connected to the gate of a field effect transistor (FET).

21. The circuit of claim 20, wherein the transconductance resistor is connected to the gate through an operational amplifier having an impedance of no more than $10^7$ Ohms.

22. The circuit of claim 21, wherein the inverting input of the operational amplifier is connected to the source of the FET.

23. The circuit of claim 22, wherein the non-inverting input of the operational amplifier is connected to a signal voltage reference.

24. The circuit of claim 20, comprising an output resistor connected to the source of the FET.

25. The circuit of claim 24, wherein the output resistor is connected to the FET through a bipolar junction transistor (BJT).

26. The circuit of claim 25, wherein the base of the BJT is connected to the source of the FET.

27. The circuit of claim 20, comprising a shorting capacitor connecting the drain of the FET to the source of the FET.

28. The circuit of claim 20, comprising an output voltage divider connected between the gate of the FET and the source of the FET.

* * * * *